(12) United States Patent
Hu et al.

(10) Patent No.: US 10,192,808 B1
(45) Date of Patent: Jan. 29, 2019

(54) SEMICONDUCTOR STRUCTURE

(71) Applicant: UNITED MICROELECTRONICS CORP., Hsin-Chu (TW)

(72) Inventors: Teng-Chuan Hu, Tainan (TW);
Chun-Hung Chen, Tainan (TW);
Chu-Fu Lin, Kaohsiung (TW);
Chun-Ting Yeh, Taipei (TW);
Chung-Hsing Kuo, Taipei (TW);
Ming-Tse Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/642,349

(22) Filed: Jul. 6, 2017

(51) Int. Cl.
| *H01L 21/00* | (2006.01) |
| *H01L 23/00* | (2006.01) |
| *H01L 23/48* | (2006.01) |
| *H01L 23/528* | (2006.01) |
| *H01L 21/768* | (2006.01) |
| *H01L 23/532* | (2006.01) |
| *H01L 21/321* | (2006.01) |

(52) U.S. Cl.
CPC ........ *H01L 23/481* (2013.01); *H01L 21/7684* (2013.01); *H01L 21/7685* (2013.01); *H01L 21/76831* (2013.01); *H01L 21/76898* (2013.01); *H01L 23/528* (2013.01); *H01L 23/53238* (2013.01); *H01L 21/3212* (2013.01)

(58) Field of Classification Search
CPC ........... H01L 21/76831; H01L 21/7684; H01L 21/7685; H01L 21/76898; H01L 21/76224; H01L 21/823481; H01L 21/768; H01L 23/481; H01L 23/528; H01L 23/53238; H01L 21/3212; H01L 23/10; H01L 23/4824
See application file for complete search history.

(56) References Cited

U.S. PATENT DOCUMENTS

| 8,378,495 | B2 * | 2/2013 | West | H01L 23/481 257/472 |
| 9,177,914 | B2 * | 11/2015 | Tseng | H01L 23/481 |
| 9,431,320 | B2 | 8/2016 | Carrillo-Ramirez | |
| 9,852,965 | B2 * | 12/2017 | Lee | H01L 23/481 |
| 2009/0194829 | A1 * | 8/2009 | Chung | B81C 1/0023 257/415 |
| 2011/0031581 | A1 * | 2/2011 | West | H01L 23/481 257/508 |
| 2014/0131841 | A1 * | 5/2014 | Tseng | H01L 23/481 257/621 |
| 2017/0047270 | A1 * | 2/2017 | Lee | H01L 23/481 |

* cited by examiner

*Primary Examiner* — Nikolay Yushin
(74) *Attorney, Agent, or Firm* — Winston Hsu

(57) ABSTRACT

A semiconductor structure includes a substrate having a frontside surface and a backside surface. A through-substrate via extends into the substrate from the frontside surface. The through-substrate via comprises a top surface. A metal cap covers the top surface of the through-substrate via. A plurality of cylindrical dielectric plugs is embedded in the metal cap. The cylindrical dielectric plugs are distributed only within a central area of the metal cap. The central area is not greater than a surface area of the top surface of the through-substrate via.

17 Claims, 4 Drawing Sheets

SEMICONDUCTOR STRUCTURE

BACKGROUND OF THE INVENTION

1. Field of the Invention

The present invention relates generally to the field of semiconductor technology. More particularly, the present invention relates to an improved metal cap structure over a through-substrate-via (TSV).

2. Description of the Prior Art

Three-dimensional (3D) packaging technology has been developed to enable vertical integration of multiple semiconductor chips. The 3D packaging technology may employ wafer-level package technology, in which the stacked substrates may be full wafers typically having integrated circuits fabricated thereon. The 3D stacked wafers can be diced into individual units after wafer bonding, each unit having two or more chips vertically bonded together through through-substrate vias (TSVs).

The TSVs are usually made by forming vertical through holes in a semiconductor wafer and filling the through holes with insulating materials and metallic materials. Copper is a preferable interconnect material for TSVs due to its high conductivity and lower specific resistance, which may reduce the interconnect resistance to achieve faster operation of a device.

However, conventional Cu TSV structures may suffer serious Cu protrusion issues. The Cu protrusion of the TSV may lower the flatness of the substrate and affect the following manufacturing processes. To reduce Cu protrusion, a metal cap is typically formed on the TSV. However, Cu dishing effect may occur when forming the large-area metal cap on the TSV.

SUMMARY OF THE INVENTION

In view of the foregoing, embodiments of the invention provide an improved metal cap structure over a through-substrate-via (TSV).

According to one as aspect of the invention, a semiconductor structure is disclosed. The semiconductor structure includes a substrate having a frontside surface and a backside surface. A through-substrate via extends into the substrate from the frontside surface. The through-substrate via comprises a top surface. A metal cap covers the top surface of the through-substrate via. A plurality of cylindrical dielectric plugs is embedded in the metal cap. The cylindrical dielectric plugs are distributed only within a central area of the metal cap. The central area is not greater than a surface area of the top surface of the through-substrate via.

According to one as aspect of the invention, a semiconductor structure is disclosed. The semiconductor structure includes a substrate having a frontside surface and a backside surface. A through-substrate via extends into the substrate from the frontside surface. The through-substrate via comprises a top surface. A metal cap covers the top surface of the through-substrate via. A plurality of first cylindrical dielectric plugs is embedded in the metal cap and distributed within a central area of the metal cap. A plurality of second cylindrical dielectric plugs is embedded in the metal cap and distributed within a peripheral area outside the central area of the metal cap.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Before the further description of the preferred embodiment, the specific terms used throughout the text will be described below.

The term "etch" is used herein to describe the process of patterning a material layer so that at least a portion of the material layer after etching is retained. For example, it is to be understood that the method of etching silicon involves patterning a mask layer (e.g., photoresist or hard mask) over silicon and then removing silicon from the area that is not protected by the mask layer. Thus, during the etching process, the silicon protected by the area of the mask will remain.

In another example, however, the term "etch" may also refer to a method that does not use a mask, but leaves at least a portion of the material layer after the etch process is complete. The above description is used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The terms "forming", "depositing" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

According to various embodiments, for example, deposition may be carried out in any suitable known manner. For example, deposition may include any growth, plating, or transfer of material onto the substrate. Some known techniques include physical vapor deposition (PVD), chemical vapor deposition (CVD), electrochemical deposition (ECD), molecular beam epitaxy (MBE), atomic layer deposition (ALD), and plasma enhanced CVD (PECVD).

The term "substrate" described in the text is commonly referred to as a silicon substrate. However, the substrate may also be any semiconductor material, such as germanium, gallium arsenide, indium phosphide and the like. In other embodiments, the substrate may be non-conductive, such as glass or sapphire wafers.

Figure 1:
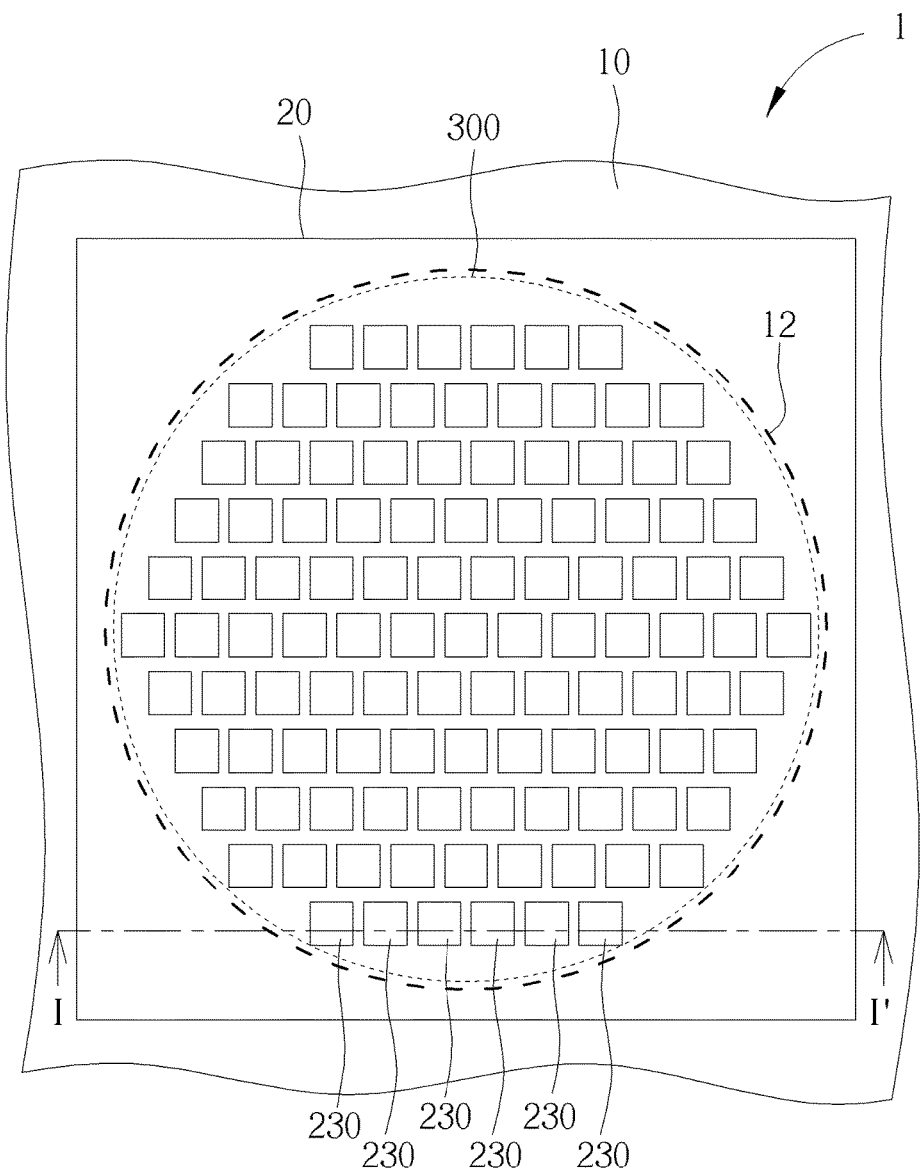
FIG. 1 is a schematic, top view of a semiconductor structure according to one embodiment of the invention.
Figure 2:
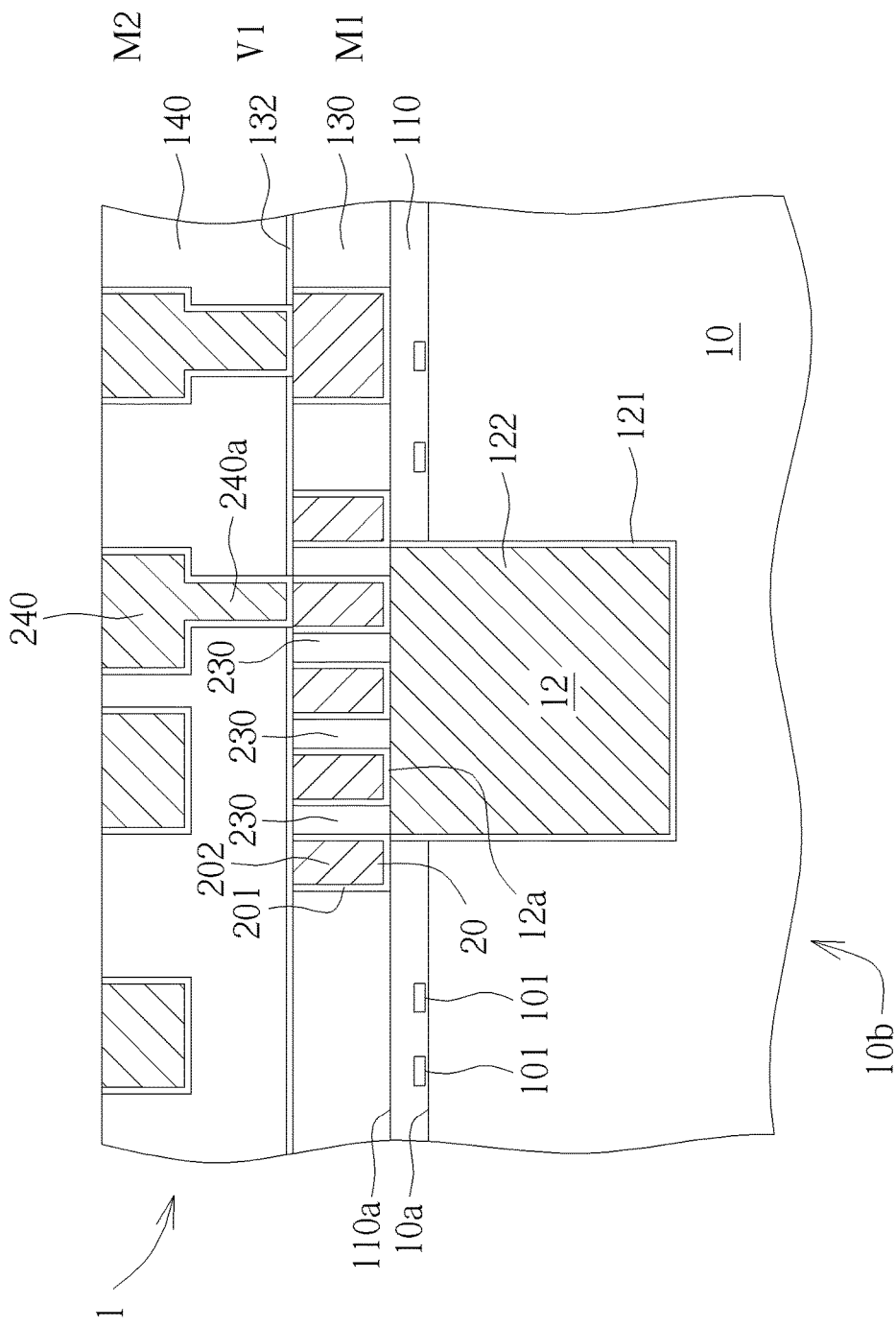
FIG. 2 is a schematic, cross-sectional view taken along line I-I' in FIG. 1.

Please refer to FIG. 1 and FIG. 2. FIG. 1 is a schematic, top view of a semiconductor structure according to one embodiment of the invention. FIG. 2 is a schematic, cross-sectional view taken along line I-I' in FIG. 1.

As shown in FIG. 1 and FIG. 2, the semiconductor structure 1 comprises a substrate 10 such as a silicon substrate, but is not limited thereto. The substrate 10 has a frontside surface 10a and a backside surface 10b. A plurality of circuit elements 101 are formed on the frontside surface 10a. For example, the plurality of circuit elements 101 may comprise field effect transistors or memory cells, but is not limited thereto.

An inter-layer dielectric (ILD) layer 110 is deposited on the frontside surface 10a. The ILD layer 110 covers the plurality of circuit elements 101. For example, the ILD layer 110 may comprises silicon oxide, silicon nitride, BPSG, PSG, or low-k dielectric materials, but is not limited thereto. The ILD layer 110 has a top surface 110a.

A through-substrate via (TSV) 12 extends into the substrate 10 from the frontside surface 10a. According to the embodiment of the invention, the through-substrate via 12 penetrates through the ILD layer 110. The through-substrate via 12 comprises a top surface 12a. The top surface 12a of the through-substrate via 12 is a flat top surface and is flush with the top surface 110a of the ILD layer 110. It is understood that multiple TSVs may be formed in the substrate 10 although only one TSV is shown in the figures.

According to the embodiment of the invention, the through-substrate via 12 may comprise an insulating layer 121 such as a silicon oxide layer, and a conductive layer 122 such as a copper layer. The insulating layer 121 insulates the conductive layer 122 from the substrate 10.

A metal cap 20 is situated directly on the top surface 12a of the through-substrate via 12. The metal cap 20 covers the top surface 12a of the through-substrate via 12. According to the embodiment of the invention, the metal cap 20 is embedded in a first inter-metal dielectric (IMD) layer 130 on the ILD layer 110.

According to the embodiment of the invention, the metal cap 20 is fabricated by using a copper damascene process. According to the embodiment of the invention, the metal cap 20 comprises a diffusion barrier metal layer 201 and a copper layer 202. For example, the metal cap 20 is fabricated in the first metal level or $M_1$.

According to the embodiment of the invention, the metal cap 20 may have a rectangular outline. For example, the metal cap 20 may have a dimension of about 7 μm×7 μm. The metal cap 20 is typically used to prevent copper extrusion of the through-substrate via 12. However, the metal cap 20 is prone to dishing during the chemical mechanical polishing (CMP) process. The present invention addresses this issue.

To cope with the copper dishing effect, a plurality of cylindrical dielectric plugs 230 is embedded in the metal cap 20. The cylindrical dielectric plugs 230 are distributed only within a central area 300 of the metal cap 20, where the copper dishing would mostly likely to occur. The cylindrical dielectric plugs 230 and the first inter-metal dielectric (IMD) layer 130 are composed of the same dielectric layer. Each of the cylindrical dielectric plugs 230 is isolated and is not in direct contact with the surrounding first inter-metal dielectric (IMD) layer 130.

As can be best seen in FIG. 1, the plurality of cylindrical dielectric plugs 230 is arranged only within the central area 300 of the metal cap 20 in a staggered manner. According to the embodiment of the invention, the central area 300 is not greater than the surface area 12a of the top surface of the through-substrate via 12.

By disposing the cylindrical dielectric plugs 230 within the central area 300 of the metal cap 20 in a staggered manner, the copper dishing effect is avoided or alleviated.

Figure 3:
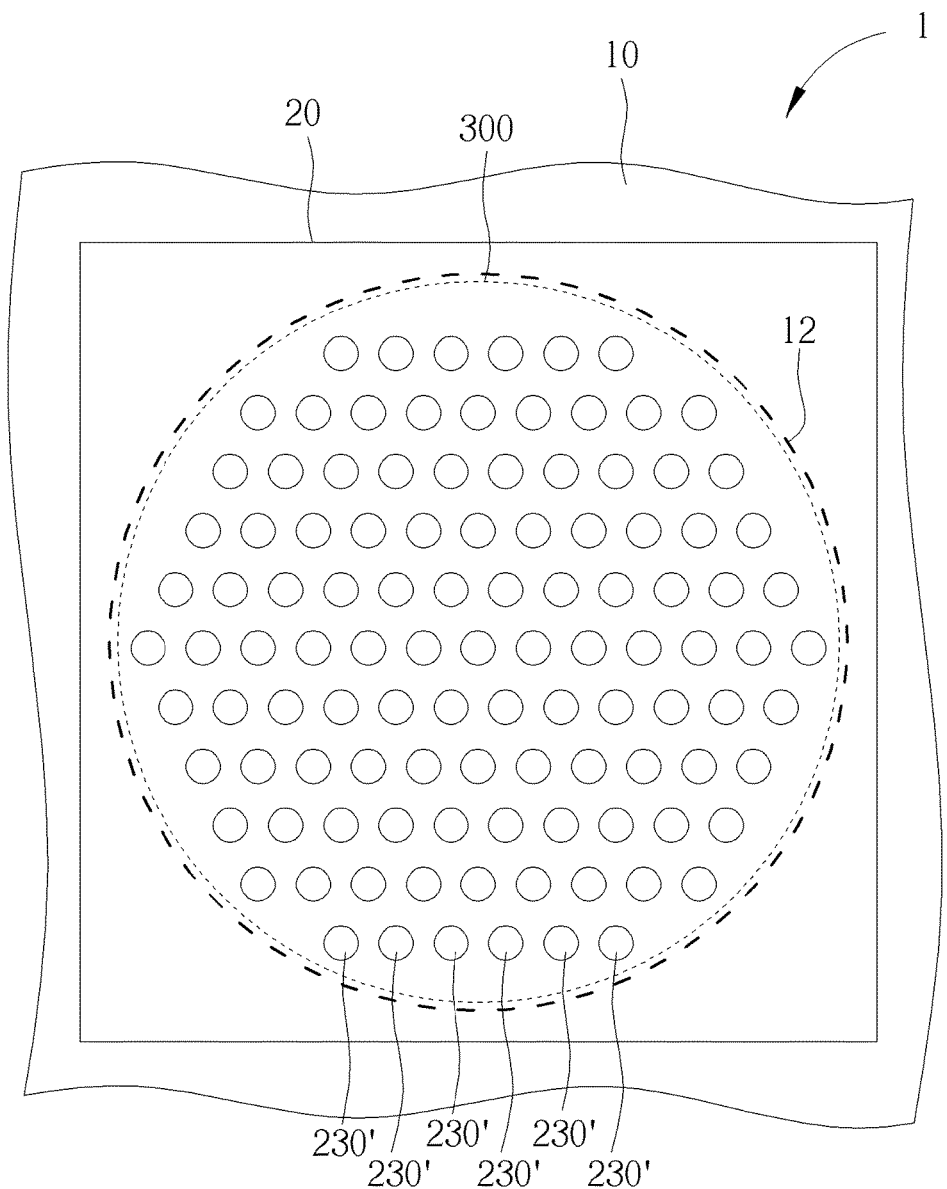
FIG. 3 is a schematic, top view showing the shape of each cylindrical dielectric plug in the metal cap according to another embodiment of the invention.

According to one embodiment, each of the cylindrical dielectric plugs 230 may have a rectangular outline when viewed from the above, as shown in FIG. 1. However, it is understood that, in another embodiment, each of the cylindrical dielectric plugs 230 may have other shapes, for example, a circular-shaped cylindrical dielectric plug 230', as shown in FIG. 3.

As shown in FIG. 2, a second inter-metal dielectric (IMD) layer 140 may be deposited on the first IMD layer 130 and on the metal cap 20. According to the embodiment of the invention, prior to the deposition of the second IMD layer 140, an etch stop layer 132 may be deposited on the first IMD layer 130 and on the metal cap 20.

An interconnection structure 240 may be formed in the second IMD layer 140. The interconnection structure 240 may be electrically connected to the metal cap 20 through a conductive via 240a in the second IMD layer 140. The interconnection structure 240 may be formed by using a copper dual damascene process, but is not limited thereto. For example, the interconnection structure 240 may be formed in the second metal layer $M_2$ and via layer $V_1$.

Figure 4:
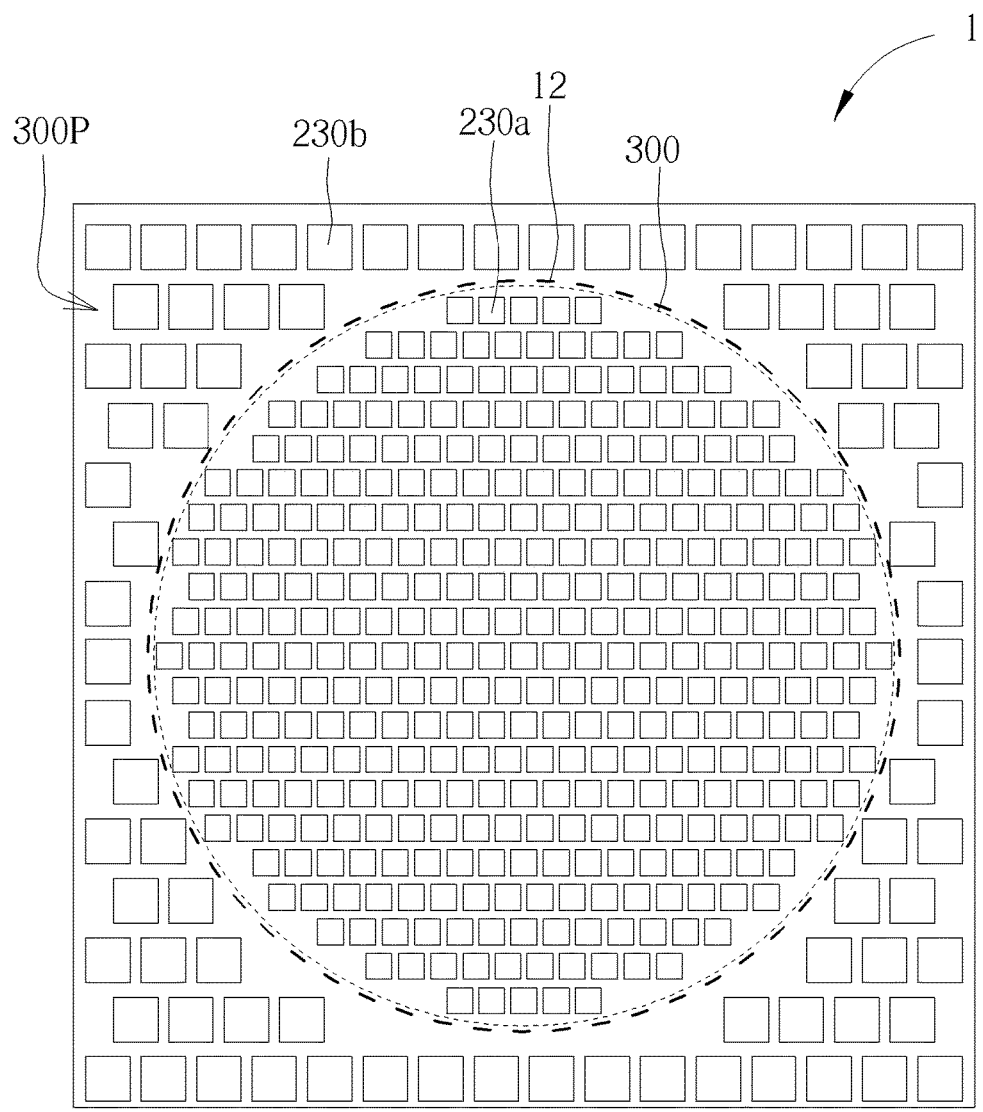
FIG. 4 is a schematic, top view showing the layout of the cylindrical dielectric plugs in the metal cap according to another embodiment of the invention.

FIG. 4 is a schematic, top view showing the layout of the cylindrical dielectric plugs in the metal cap according to another embodiment of the invention, wherein like numeral numbers designate like regions, layers, or elements.

As shown in FIG. 4, likewise, a through-substrate via 12 extends into the substrate 10 from the frontside surface 10a. The through-substrate via 12 comprises a top surface 12a. A metal cap 20 covers the top surface 12a of the through-substrate via 12.

A plurality of first cylindrical dielectric plugs 230a is embedded in the metal cap 20 and is distributed within a central area 300 of the metal cap 20. A plurality of second cylindrical dielectric plugs 230b is embedded in the metal cap 20 and is distributed within a peripheral area 300p outside the central area 300 of the metal cap 20.

According to one embodiment, the metal cap 20 has a rectangular outline. For example, the metal cap 20 may have a dimension of about 7 μm×7 μm.

According to one embodiment, a dimension of each of the first cylindrical dielectric plugs 230a is smaller than that of each of the second cylindrical dielectric plugs 230b. According to one embodiment, the dimension of each of the first cylindrical dielectric plugs 230a ranges between 0.13 μm and 0.25 μm. According to one embodiment, the dimension of each of the second cylindrical dielectric plugs 230b ranges between 0.13 μm and 0.25 μm.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate having a frontside surface and a backside surface;

a through-substrate via extending into the substrate from the frontside surface, wherein the through-substrate via comprises a top surface;

a metal cap covering the top surface of the through-substrate via; and a plurality of cylindrical dielectric plugs embedded in the metal cap, wherein the cylindrical dielectric plugs are distributed only within a central area of the metal cap, and wherein the central area is not greater than a surface area of the top surface of the through-substrate via, wherein the metal cap is made of metallic material and is of a perforated screen structure with a plurality of rectangular openings filled by dielectric material, and wherein all of the cylindrical dielectric plugs are surrounded by the metal cap material.

2. The semiconductor structure according to claim 1, wherein the plurality of cylindrical dielectric plugs is arranged within the central area of the metal cap in a staggered manner.

3. The semiconductor structure according to claim 1, wherein the metal cap has a rectangular outline.

4. The semiconductor structure according to claim 3, wherein the metal cap has a dimension of about 7 μm.

5. The semiconductor structure according to claim 1 further comprising a plurality of circuit elements disposed on the frontside surface.

6. The semiconductor structure according to claim 5 further comprising an inter-layer dielectric (ILD) layer covering the plurality of circuit elements.

7. The semiconductor structure according to claim 6, wherein the through-substrate via penetrates through the ILD layer.

8. The semiconductor structure according to claim 6, wherein the top surface of the through-substrate via is a flat top surface and is flush with a top surface of the ILD layer.

9. The semiconductor structure according to claim 8, wherein the metal cap is embedded in a first inter-metal dielectric (IMD) layer on the ILD layer.

10. The semiconductor structure according to claim 9 further comprising a second inter-metal dielectric (IMD) layer on the first IMD layer and on the metal cap.

11. The semiconductor structure according to claim 10 further comprising an interconnection structure in the second IMD layer, wherein the interconnection structure is electrically connected to the metal cap through a conductive via in the second IMD layer.

12. A semiconductor structure, comprising:
a substrate having a frontside surface and a backside surface;
a through-substrate via extending into the substrate from the frontside surface, wherein the through-substrate via comprises a top surface;
a metal cap covering the top surface of the through-substrate via;
a plurality of first cylindrical dielectric plugs embedded in the metal cap and distributed within a central area of the metal cap; and
a plurality of second cylindrical dielectric plugs embedded in the metal cap and distributed within a peripheral area outside the central area of the metal cap, wherein the metal cap is made of metallic material and is of a perforated screen structure with a plurality of rectangular openings filled by dielectric material.

13. The semiconductor structure according to claim 12, wherein the metal cap has a rectangular outline.

14. The semiconductor structure according to claim 13, wherein the metal cap has a dimension of about 7 μm×7 μm.

15. The semiconductor structure according to claim 12, wherein a dimension of each of the first cylindrical dielectric plugs is smaller than that of each of the second cylindrical dielectric plugs.

16. The semiconductor structure according to claim 15, wherein the dimension of each of the first cylindrical dielectric plugs ranges between 0.13 μm and 0.25 μm.

17. The semiconductor structure according to claim 15, wherein the dimension of each of the second cylindrical dielectric plugs ranges between 0.13 μm and 0.25 μm.

* * * * *